(12) United States Patent
Ku et al.

(10) Patent No.: US 7,255,529 B2
(45) Date of Patent: Aug. 14, 2007

(54) COOLING FAN MOUNTING ARRANGEMENT WITH VIBRATION ISOLATION MEMBER

(75) Inventors: Chin-Long Ku, Tu-Cheng (TW); Chin-Wen Yeh, Tu-Cheng (TW); Zheng-Neng Lin, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 27 days.

(21) Appl. No.: 11/015,320

(22) Filed: Dec. 17, 2004

(65) Prior Publication Data

US 2006/0133035 A1   Jun. 22, 2006

(51) Int. Cl.
*F01D 5/10* (2006.01)

(52) U.S. Cl. .............. 415/119; 415/213.1; 415/214.1; 415/220

(58) Field of Classification Search ............... 415/119, 415/213.1, 214.1, 220, 222; 248/562, 603, 248/609, 638; 361/687, 690, 694, 695, 697
See application file for complete search history.

(56) References Cited

U.S. PATENT DOCUMENTS

| | | | |
|---|---|---|---|
| 4,568,243 A | | 2/1986 | Schubert et al. |
| 4,807,718 A | * | 2/1989 | Lotz ........................... 181/202 |
| 5,208,730 A | | 5/1993 | Tracy |
| 5,316,423 A | * | 5/1994 | Kin .............................. 411/510 |
| 6,254,343 B1 | | 7/2001 | Schmidt et al. |
| 6,351,380 B1 | | 2/2002 | Curlee et al. |
| 2006/0056966 A1 | * | 3/2006 | Liu ............................. 415/220 |

* cited by examiner

*Primary Examiner*—Igor Kershteyn
(74) *Attorney, Agent, or Firm*—Morris Manning & Martin LLP); Tim Tingkang Xia, Esq.

(57) ABSTRACT

A mounting arrangement for mounting a cooling fan to a support member (30) includes a fan frame (10) having a mounting flange (14) for confronting with the support member, and a plurality of vibration isolation members (20) attached to the mounting flange. When the fan frame is secured to the support member, the vibration isolation members are pressingly sandwiched between the mounting flange and the support member.

12 Claims, 3 Drawing Sheets

COOLING FAN MOUNTING ARRANGEMENT WITH VIBRATION ISOLATION MEMBER

TECHNICAL FIELD

The present invention relates generally to cooling fans for electronic devices, and more particularly to a cooling fan arrangement with a vibration isolation member.

BACKGROUND

To prevent an interior heat buildup which could potentially damage internal electronic operating components, various types of personal computers are typically provided with one or more internal cooling fans. While the computer is running, each fan normally operates to continuously draw ambient air into the computer housing structure through a housing air intake opening, flow the air generally across the operating components to absorb heat generated thereby, and then discharge the heated air from the interior of the housing through a suitable air discharge opening formed therein.

Despite the fact that they are usually rather small in comparison with the whole computer system, computer cooling fans can generate an undesirable amount of vibration, and attendant housing structure vibration noise, if care is not taken to properly isolate them from the interior computer housing support structure upon which they are mounted. On this account, various fan mounting structures have heretofore been utilized in an attempt to isolate the computer housing structure from fan vibration and thereby attenuate fan vibration-created noise during computer operation.

U.S. Pat. No. 5,208,730 discloses such a mounting arrangement for a cooling fan. The cooling fan is received in a mounting frame, and the mounting frame is installed within a computer chassis. A pair of elongated elastomeric vibration isolation members is attached to opposite sides of the mounting frame. This arrangement avoids the mounting frame to directly contact the computer chassis, thereby isolating the computer chassis from fan vibration.

As a general proposition, this method of mounting the cooling fan within a computer chassis yields a satisfactory performance from the standpoint of vibration and noise reduction. However, from cost standpoint, it has limitations and disadvantages. For example, the vibration isolation member is large and consumes a considerable mount of elastomeric material, which increases too much cost per unit.

Therefore, a vibration isolation mounting arrangement for a cooling fan with low cost is desired.

SUMMARY OF THE INVENTION

The present invention is directed to a computer cooling fan vibration isolation member which will not increase too much cost to a cooling fan mounting arrangement.

A mounting arrangement for mounting a cooling fan to a support member comprises a fan frame having a mounting flange for being confronted with the support member, and a plurality of vibration isolation members attached to the mounting flange. When the fan frame is secured to the support member, the vibration isolation members are pressingly sandwiched between the mounting flange and the support member.

Other objects, advantages and novel features of the present invention will be drawn from the following detailed description of the preferred embodiments of the present invention with attached drawings, in which:

DESCRIPTION OF PREFERRED EMBODIMENTS

Figure 1:
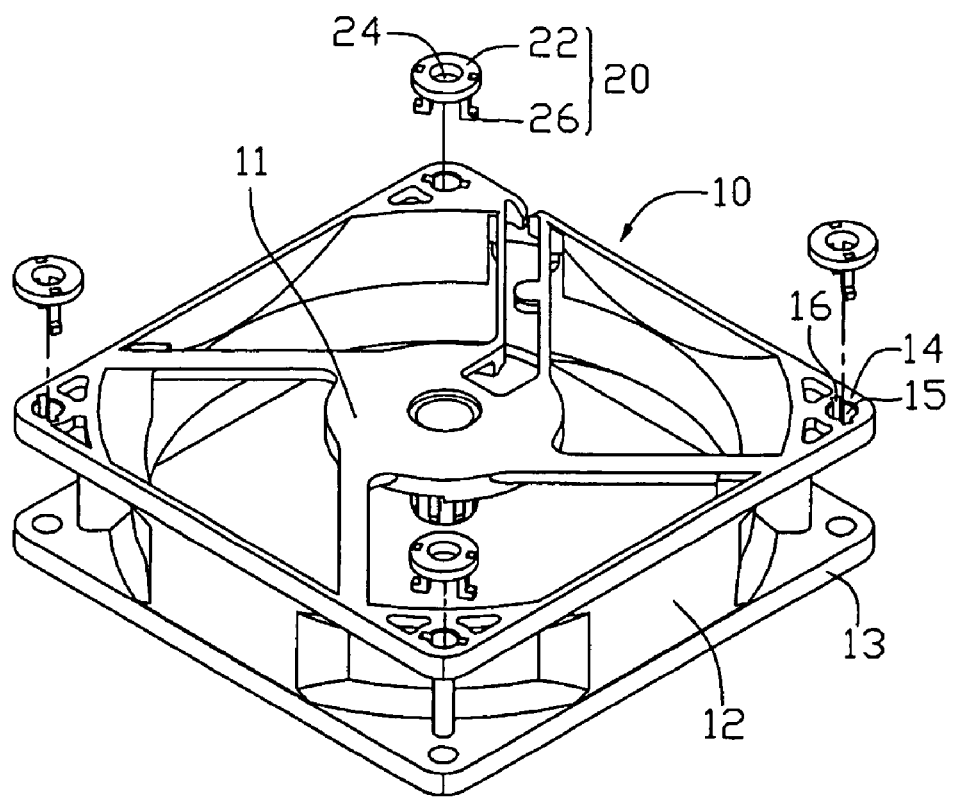
FIG. 1 is an exploded, isometric view of a cooling fan mounting arrangement according to a preferred embodiment of the present invention, together with a fan frame.

FIG. 1 illustrates a fan frame 10 of a cooling fan and a vibration isolation member 20 of a cooling fan mounting arrangement in accordance with a preferred embodiment. For the sake of clarity, the fan frame 10 is viewed from an inverted aspect, i.e., a bottom side of the fan frame 10 faces up.

The fan frame 10 comprises a fan base 11 and a guard frame 12 formed around the fan base 11. The fan base 11 is used for supporting components of the cooling fan such as a bearing, a stator and a rotor. Upper and lower mounting flanges 13, 14 are outwardly formed at upper and lower edges of the guard frame 12. Each of the upper and lower mounting flanges 13, 14 defines a through aperture 15 therein. A pair of opposed slots 16 is defined through an inner periphery of the lower mounting flange 14 at each through aperture 15. The slots 16 are in communication with the through aperture 15.

The vibration isolation members 20 are made of material having good resiliency such as plastic or elastomeric. Each vibration isolation member 20 comprises a ring body 22 having a through hole 24, and a pair of locking legs 26 depending from the ring body 22. The through hole 24 of the ring body 22 is greater in diameter than the through aperture 15 of the lower mounting flange 14, for allowing a fastener to readily extending through the through aperture 15 and the through hole 24 if the fastener is selected to position the fan frame 10. Because of the greater diameter of the through hole 24, the fastener will not engage the ring body 22 of the vibration isolation member 20 during extension, thereby protecting the vibration isolation member 20 from being scratched by the fastener. The legs 26 extend downwardly from the ring body 22 and then extend in opposite directions away from each other. The legs 26 correspond to the slots 16 of the lower mounting flange 14, and a distance between outmost ends of the locking legs 26 is greater than an inner distance between two opposed portions of the inner periphery at the slots 16 of the lower mounting flange 14.

Figure 2:
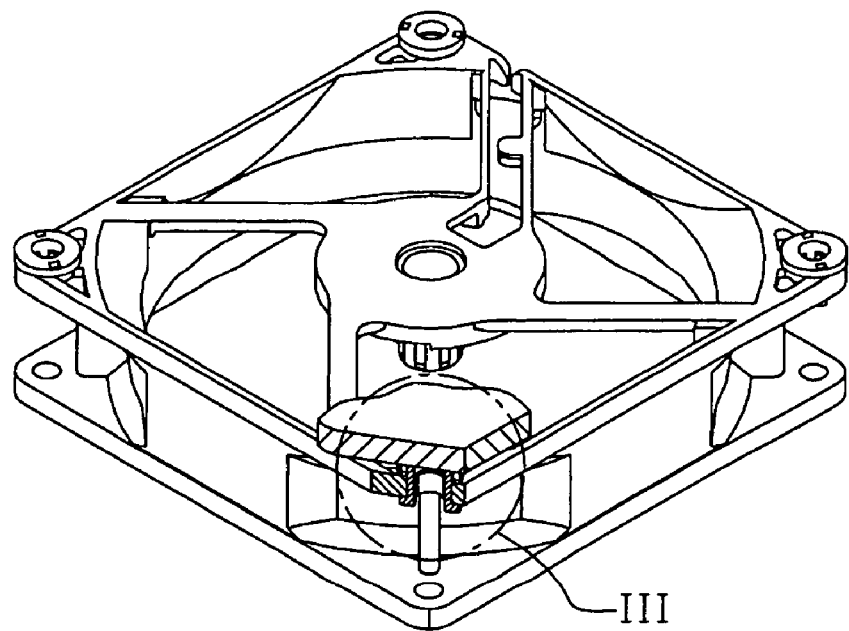
FIG. 2 is an assembled view of the mounting arrangement of FIG. 1, together with a computer chassis.
Figure 3:
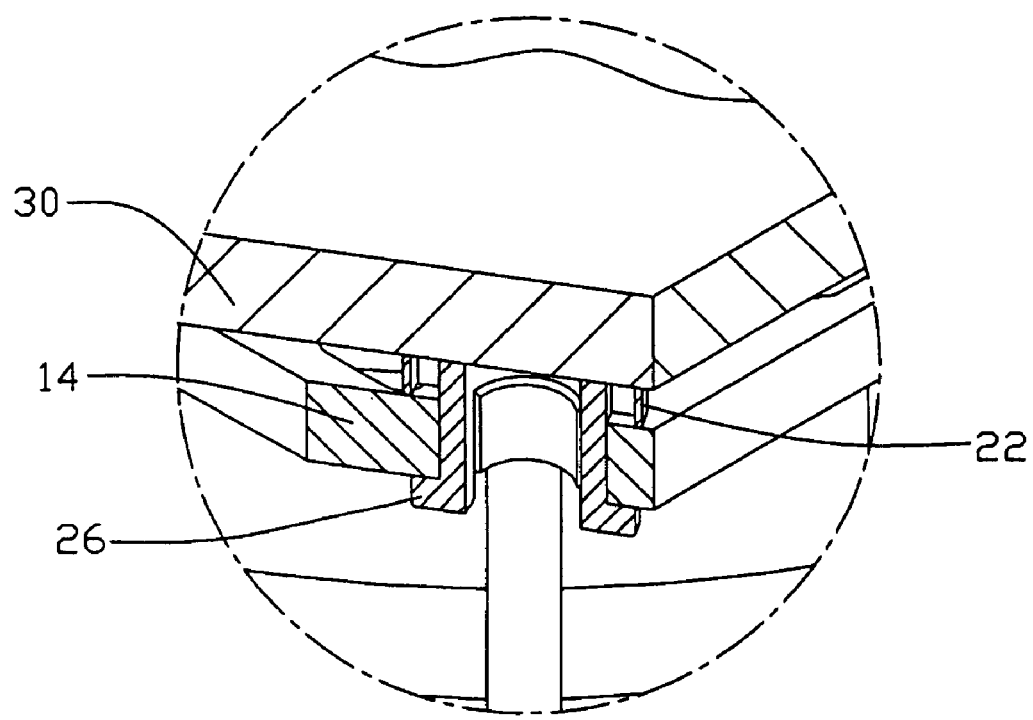
FIG. 3 is an enlarged view of an encircled portion of FIG. 2.

Referring to FIGS. 2 and 3, assembly of the cooling fan to a second member such as a computer chassis is illustrated. Only a support portion 30 of the computer chassis is shown in FIGS. 2 and 3. In assembly of the vibration isolation member 20 to the fan frame 10, the locking legs 26 of each vibration isolation member 20 are aligned with the slots 16 of the lower mounting flange 14 at the bottom side thereof and are squeezed toward each other to reduce the distance between the outer ends of the locking legs 26 so that the locking legs 26 are capable of extending through the slots 16. Each vibration isolation member 20 is pushed toward the lower mounting flange 14 to enable the locking legs 26 to resiliently engagingly slide through the slots 16. Once having completely extended through the slots 16, the locking legs 26 return back to their original states and engage with a top side of the lower mounting flange 14 around the slots 16 to retain the ring body 22 on the bottom side of lower mounting flange 14. The through hole 24 of each vibration isolation member 20 is in alignment with one corresponding through aperture 15 of the lower mounting flange 14.

The vibration isolation members 20 are attached to the mounting flange 14 prior to attachment of the cooling fan to the chassis. The methods of mounting the fan frame 10 to the support portion 30 of the computer chassis can be various. For example, the fan frame 14 is mounted to the support portion 30 by a plurality of fasteners such as screws respectively extending through the through apertures 15 of the lower mounting flange 14, the through holes 24 of the vibration isolation member 20, and into mounting holes defined in the support portion 30. Alternatively, the fan frame 14 can be mounted to the support portion 30 by a plurality of clips engaged with the fan frame 10 and the support portion 30. However the fan frame 10 is mounted to the support portion 30, the ring body 22 of each vibration isolation member 20 is pressingly sandwiched between the underside of lower mounting flange 14 and a surface of the support portion 30. Vibration produced by the cooling fan thus can be isolated from the support portion 30, thereby reducing the fan vibration-created noise during computer operation.

In the present invention, the vibration isolation member 20 is much smaller in comparison with those in conventional cooling fan anti-vibration mounting arrangements. Raw material for the vibration isolation member 20 is saved, and manufacturing cost is accordingly reduced.

In the preferred embodiment, the locking legs 26 are symmetrical about an axis of the through hole 24 of the ring body 22. Therefore, the locking legs 26 and the axis of the ring body 22 are commonly located in one hypothetical plane crossing the ring body 22.

Figure 4:
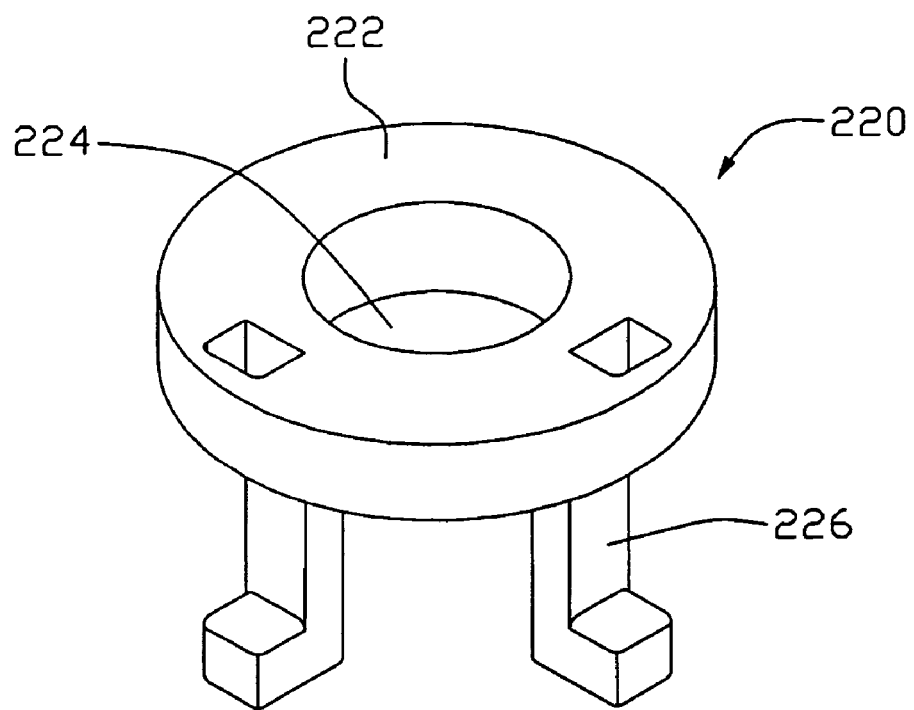
FIG. 4 is a isometric view of a vibration isolation member according to an alternative embodiment of the present invention.

FIG. 4 shows a vibration isolation member 220 according to an alternative embodiment of the present invention. In this alternative embodiment, the vibration isolation member 220 comprises a ring body 222 defining a through hole 224, and a pair of locking legs 226 depending from the ring body 222. The locking legs 226 are circumferentially spaced substantially 90 degrees with each other. The position of the slots in the fan frame for receiving the locking legs 226 are accordingly changed.

Figure 5:
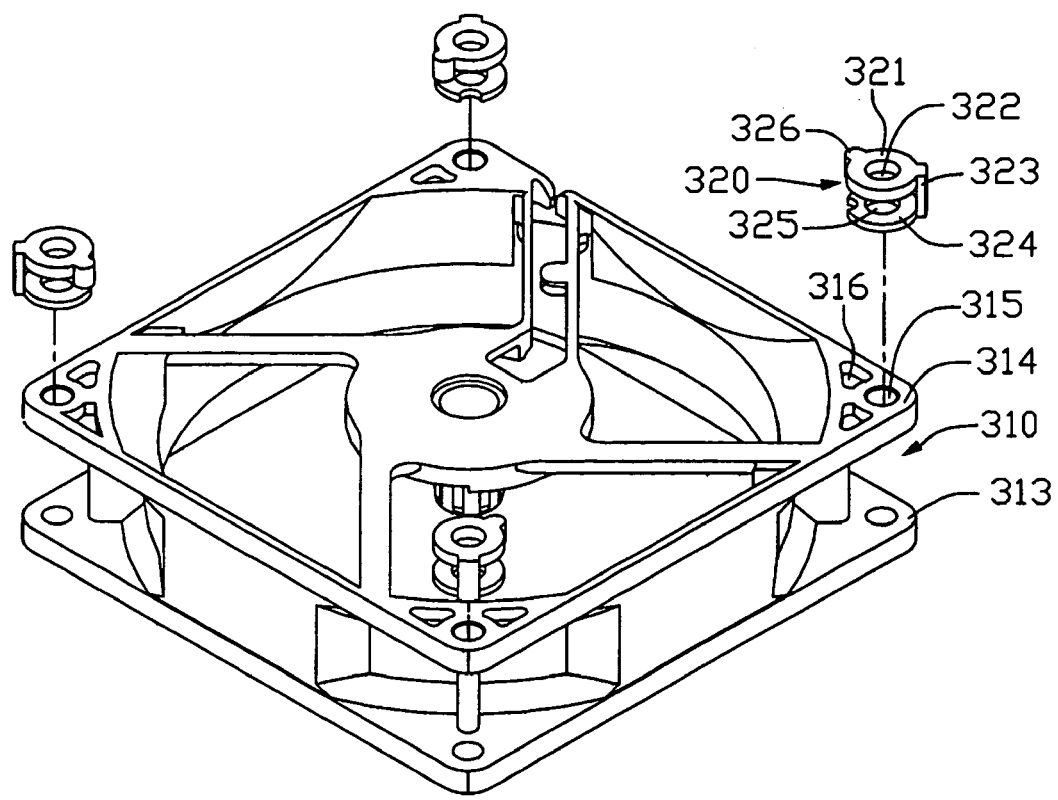
FIG. 5 is an exploded, isometric view of a cooling fan mounting arrangement according to an further alternative embodiment of the present invention.

FIG. 5 shows a cooling fan arrangement according to a further alternative embodiment. The cooling fan arrangement of this embodiment comprises a fan frame 310 having upper and lower mounting flanges 313, 314 of generally square shape, and a plurality of vibration isolation members 320 attached to the lower mounting flanges 314. A plurality of through apertures 315 is defined in the lower mounting flange 314 at corners thereof. A slot 316 is defined in the lower mounting flange 314 adjacent each through aperture 315.

Figure 6:
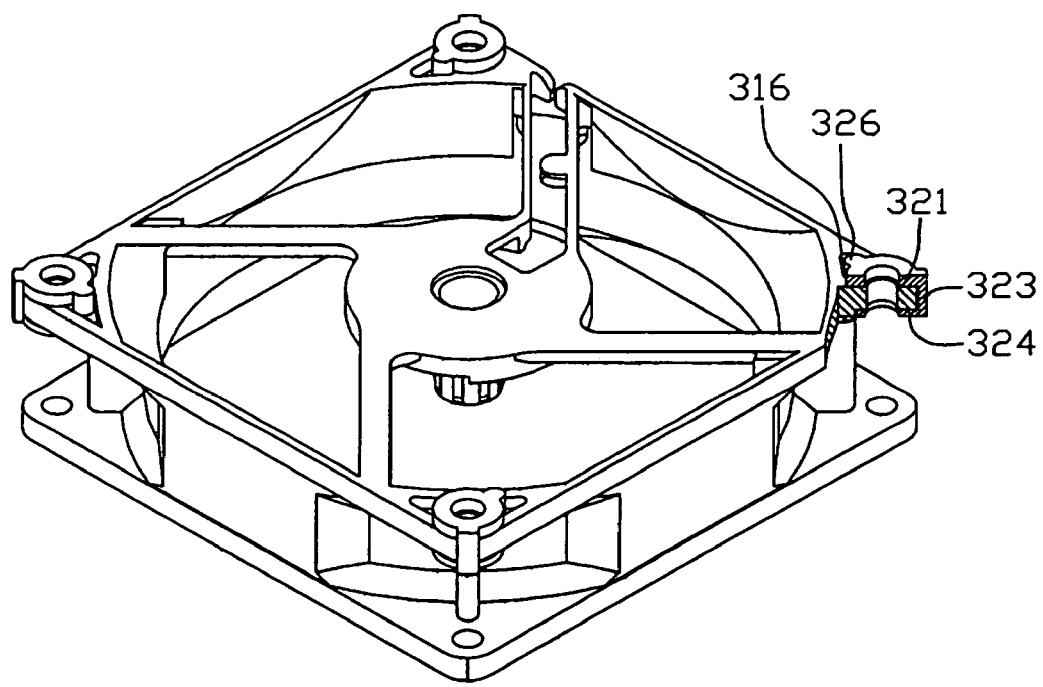
FIG. 6 is an assembled view of the mounting arrangement of FIG. 5.

Each vibration isolation member 320 comprises a lower ring body 321 having a center through hole 322, an upper ring body 324 having a center through hole 325, and a connecting wall 323 for joining the lower and upper ring bodies 321, 324. A distance between the lower and upper ring bodies 321, 324 is equal to a thickness of the lower mounting flange 314, so that each vibration isolation member 320 is capable of receiving a corresponding corner of the lower mounting flange 314 between the lower and upper ring bodies 321, 324 thereof as shown in FIG. 6. Alternatively, the distance between the lower and upper ring bodies 321, 324 is slightly less than the thickness of the lower mounting flange 314 so that the vibration isolation members 320 can be attached to the lower mounting flange 314 with slight deformation of the vibration isolation members 320. The through holes 322, 325 are slightly greater in diameter than the through aperture 315 of the lower mounting flange 314 for the same reason as described in the preferred embodiment. A protrusion 326 is fanned on an outer edge of each lower ring body 321. The protrusion 326 extends toward the upper ring body 324 a distance for extending into a corresponding slot 316 of the lower mounting flange 314.

Referring to FIG. 6, in assembly of the vibration isolation members 320 to the fan frame 310, each vibration isolation member 320 is disposed around a corresponding corner of the lower mounting flange 314 with the through holes 322, 325 registered with the through aperture 315 of the lower mounting flange 314. The upper and lower ring bodies 324, 321 abut a topside and an underside of the lower mounting flange 314 respectively to prevent vertical movement of the vibration isolation member 320 with respect to the lower mounting flange 314. The protrusion 326 engages into the slot 316 to prevent horizontal movement of the vibration isolation member 320 with respect to the lower mounting flange 314. Thus, the vibration isolation members 320 are mounted to the fan frame 310.

When the fan frame 310 is mounted to a second member such as a support portion of a computer chassis, the lower ring body 321 of each vibration isolation member 320 is resiliently engagingly sandwiched between the support portion and the lower mounting flange 314. Vibration produced by the cooling fan thus can be isolated from the support portion, thereby reducing the fan vibration-created noise during computer operation.

It is understood that the invention may be embodied in other forms without departing from the spirit thereof. The above-described examples and embodiments are to be considered in all respects as illustrative and not restrictive, and the invention is not to be limited to the details given above.

What is claimed is:

1. A mounting arrangement for mounting a cooling fan to a support member, the mounting arrangement comprising:
   a fan frame comprising a mounting flange for confronting with the support member, the mounting flange defining a plurality of through apertures therein; and
   a plurality of vibration isolation members attached to the mounting flange around the through apertures respectively, each of the vibration isolation members comprising a resilient body formed at a topmost portion thereof for being pressingly sandwiched between the mounting flange and the support member when the fan frame is secured to the support member, and an engaging unit extending downwardly from the resilient body for being engaged with the mounting flange; wherein the resilient body defines a though hole for being in alignment with the through aperture of the mounting flange, and the through hole is greater than the through aperture of the mounting flange in diameter.

2. The mounting arrangement of claim 1, wherein the engaging unit comprises a locking leg extending from the resilient body, and the locking leg engages with the mounting flange to retain the vibration isolation member on the mounting flange.

3. The mounting arrangement of claim 2, wherein the mounting flange defines a slot corresponding to the locking leg, and the locking leg extends through the slot and engages the mounting flange at an opposite side of the mounting flange.

4. The mounting arrangement of claim 3, wherein the slot is formed in an inner periphery of the mounting flange at the through aperture.

5. The mounting arrangement of claim 2, wherein the locking leg extends downwardly from an outer periphery of the resilient body and then outwardly.

6. The mounting arrangement of claim 1, wherein the resilient body is a first body of each of the vibration isolation members located at one side of the mounting flange, and the engaging unit comprises a second body located at an opposite side of the mounting flange and a connecting wall to join the first and second bodies.

7. The mounting arrangement of claim 6, wherein the second body defines a through hole for being in alignment with the through aperture of the mounting flange, and the through hole of the second body is greater than the through aperture in diameter.

8. The mounting arrangement of claim 6, wherein the mounting flange defines a slot adjacent each of the through apertures, and the first body forms a protrusion engaging into the slot.

9. A cooling fan assembly comprising:
a cooling fan comprising a fan frame forming a mounting flange of a generally square shape;
a support member to which the cooling fan is attached, the support member defining a surface corresponding to the mounting flange;
a plurality of vibration isolation members each comprising a resilient body pressingly sandwiched between the mounting flange and the surface when the cooling fan is attached to the support member, an engaging unit extending downwardly from the resilient body for being engaged with the mounting flange; wherein
the vibration isolation members are attached to corners of the mounting flange; and wherein the mounting flange defines a plurality of through apertures at the corners of the mounting flange, and each of the resilient bodies defines a through hole being in alignment with a corresponding through aperture, and
wherein the mounting flange defines a plurality of slots therein, the engaging unit comprises a locking leg extending through a corresponding slot to an opposite side of the mounting flange, and the locking leg engages with the mounting flange at the opposite side of the mounting flange to retain the vibration isolation member to the mounting flange.

10. A cooling fan assembly comprising:
a cooling fan comprising a fan frame forming a mounting flange of a generally square shape;
a support member to which the cooling fan is attached, the support member defining a surface corresponding to the mounting flange;
a plurality of vibration isolation members each comprising a resilient body pressingly sandwiched between the mounting flange and the surface when the cooling fan is attached to the support member, an engaging unit extending downwardly from the resilient body for being engaged with the mounting flange; wherein
the vibration isolation members are attached to corners of the mounting flange; and wherein the mounting flange defines a plurality of through apertures at the corners of the mounting flange, and each of the resilient bodies defines a through hole being in alignment with a corresponding through aperture,
wherein the engaging unit comprises another body located at a side of the mounting flange that is opposite to the surface of the support member, and a connecting wall to join said resilient body and said another body, and
wherein the mounting flange defines a plurality of slots therein, and each of the vibration isolation members comprises a protrusion formed on said resilient body and engaged into one corresponding slot.

11. The assembly of claim 10, wherein said another body defines a through hole being in alignment with the corresponding through aperture.

12. The assembly of claim 10, wherein a distance between said resilient body and said another body is slightly less than a thickness of the mounting flange.

* * * * *